US006456120B1

(12) United States Patent
Huang

(10) Patent No.: US 6,456,120 B1
(45) Date of Patent: Sep. 24, 2002

(54) CAPACITOR-COUPLING DIFFERENTIAL LOGIC CIRCUIT

(75) Inventor: Hong-Yi Huang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/707,796

(22) Filed: Nov. 8, 2000

(30) Foreign Application Priority Data

May 5, 2000 (TW) ........................................ 89108588 A

(51) Int. Cl.[7] ........................ H03K 19/20; H03K 19/094
(52) U.S. Cl. .................... 326/115; 326/71; 365/203; 365/207
(58) Field of Search .................... 326/115, 70, 71; 327/51, 57; 365/203, 207

(56) References Cited

U.S. PATENT DOCUMENTS

| | | | |
|---|---|---|---|
| 4,354,257 A | * 10/1982 | Varshney et al. ............ | 365/207 |
| 4,396,845 A | * 8/1983 | Nakano ........................ | 326/70 |
| 4,542,306 A | * 9/1985 | Ikeda ........................... | 326/17 |
| 4,570,084 A | 2/1986 | Griffin et al. ................ | 307/452 |
| 4,843,264 A | 6/1989 | Galbraith ..................... | 307/443 |
| 4,855,628 A | * 8/1989 | Jun .............................. | 327/57 |
| 4,910,713 A | 3/1990 | Madden et al. .......... | 365/189.11 |
| 5,036,217 A | * 7/1991 | Rollins et al. ............... | 327/203 |
| 6,226,207 B1 | * 5/2001 | Suh ............................. | 365/190 |

* cited by examiner

*Primary Examiner*—Michael G. Lee
*Assistant Examiner*—Steven S. Paik
(74) *Attorney, Agent, or Firm*—Birch, Stewart, Kolasch & Birch, LLP

(57) ABSTRACT

A capacitor-coupling differential logic circuit handling the output of a differential circuit using coupling capacitors and sense amplifier. The coupling capacitors can couple a control signal to the corresponding internal terminal, i.e., the output terminal of the differential circuit. During evaluation, the differential circuit generates a voltage difference on the internal signal of the internal terminal according to the input signal and the predetermined logic operation. The sense amplifier is used to amplify and output the voltage difference on the internal; signal at the internal terminal.

17 Claims, 5 Drawing Sheets

CAPACITOR-COUPLING DIFFERENTIAL LOGIC CIRCUIT

BACKGROUND OF THE INVENTION

1. Field of the Invention

The present invention relates to a semiconductor circuit, and more particularly to a differential logic circuit using the effect of a capacitor coupling and a high-speed sense amplifier to achieve the advantage of high-speed transmission and low power consumption.

2. Description of the Prior Art

It is a design trend to use differential logic circuits for general CMOS (Complementary Metal Oxide Semiconductor) design. However, the switching probability is 1 when the dynamic differential circuit is used, thereby resulting in higher power consumption.

For instance, U.S. Pat. No. 4,570,084 discloses a differential logic circuit controlled by a clock pulse. When the clock pulse is 0, the-output differential pair is preset to a predetermined voltage (for example, 0V). When the clock pulse is 1, evaluation starts and the output differential pair is set to the corresponding differential mode using the complementary characteristic of two complementary logic gate circuits (i.e., one is "1", the other is "0"). This differential logic circuit is commonly used. The common operation mode of logic circuits is used in U.S. Pat. No. 4,570,084, wherein the differential logic signal must satisfy the corresponding voltage level to attain the correct result.

However, the differential logic signal itself need not attain the full amplitude for the corresponding logic value to be identified. As long as there is fixed voltage difference between two signals, it can be quickly amplified to the corresponding level. For instance, U.S. Pat. No. 4,843,264 discloses a sense amplifier which uses a cross-coupled circuit to amplify the small voltage difference (for example, 100 mV) between the input signals. Therefore, a small voltage difference can be amplified to a differential logic signal of normal level. Furthermore, U.S. Pat. No. 4,910,713 discloses another similar sense amplifier. The use of a sense amplifier to process differential logic signals allows a corresponding logic level to be quickly generated from a small voltage difference while reducing the power consumption.

SUMMARY OF THE INVENTION

From the above, the main object of the present invention is to provide a differential logic circuit-which uses a sense amplifier to process the differential output signal of the differential logic circuit and uses the effect of a capacitor coupling to achieve high-speed transmission and low power consumption.

From this, the main object of the present invention is to provide a capacitor-coupling differential logic circuit which uses the effect of a coupling capacitor pair (the first capacitor and the second capacitor) and sense amplifier to process the output of the differential circuit. In the differential circuit, there is at least an external input terminal and a pair of internal differential terminals, wherein the external input terminal is used to receive input signal. The first capacitor is connected to the control signal Ø2 at one end and is connected to the first internal differential terminal of the internal differential terminal pair at the other end. The second capacitor is connected to the control signal Ø2 at one end and the second internal differential terminal of the internal differential terminal pair at the other end. The control signal Ø2 can be a pulse. The first capacitor and the second capacitor can couple the control signal Ø2 to the corresponding internal differential terminal pair. For example, when the control signal Ø2 is at logic "1", the internal differential terminal pair preset to "0" can be coupled to a higher voltage state. When differential circuit evaluates, a voltage difference is generated on the internal signal of the internal differential terminal pair according to the input signal. The input terminal pair of the sense amplifier is connected to the internal differential terminal pair to amplify the internal signal voltage difference of the internal differential terminal pair and output it to the output terminal pair of the sense amplifier.

Furthermore, the present invention also provides a second capacitor coupling differential logic circuit, the difference between this circuit and the above circuit is that the coupling capacitor pair is simplified and parasitic capacitors are used instead. In the differential circuit of this embodiment, there is at least an external input terminal and an internal differential terminal pair, wherein the external input terminal is used to receive input signal and the input terminal pair of the sense amplifier is connected to the internal differential terminal pair to amplify the internal signal of the internal differential terminal pair and output it to the output terminal pair of the sense amplifier. The gates of the first input transistor and the second input transistor in the sense amplifier correspond to the input terminal pair of the sense amplifier, respectively. There is parasitic capacitance between the gate and the source of the corresponding transistor. The effect of the parasitic capacitance here is similar to that of the coupling capacitance above. There is a control transistor in the sense amplifier, the source of which is connected to the sources of the first input transistor and the second input transistor, and the drain of which is connected to a predetermined voltage. Thus, the parasitic capacitance can couple the predetermined voltage to the internal differential terminal pair when the control transistor conducts. The differential circuit can generate a voltage difference on internal signal at internal differential terminal pair according to the input signal. The sense amplifier then amplifies this voltage difference and generates the corresponding differential signal under fast and low power consumption condition.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

The present invention uses a sense amplifier to process the differential signal output from the differential logic circuit and quickly amplify the differential signal to a normal logic level when a small voltage difference appears in the differential signal and lower the power consumption. The output differential signal of the differential logic circuit preset at 0V or VDD can be coupled to small voltage difference using the coupling capacitors. The capacitor-coupling differential logic circuit of the present invention will be described in detail in the following embodiments.

First Embodiment

Figure 1:
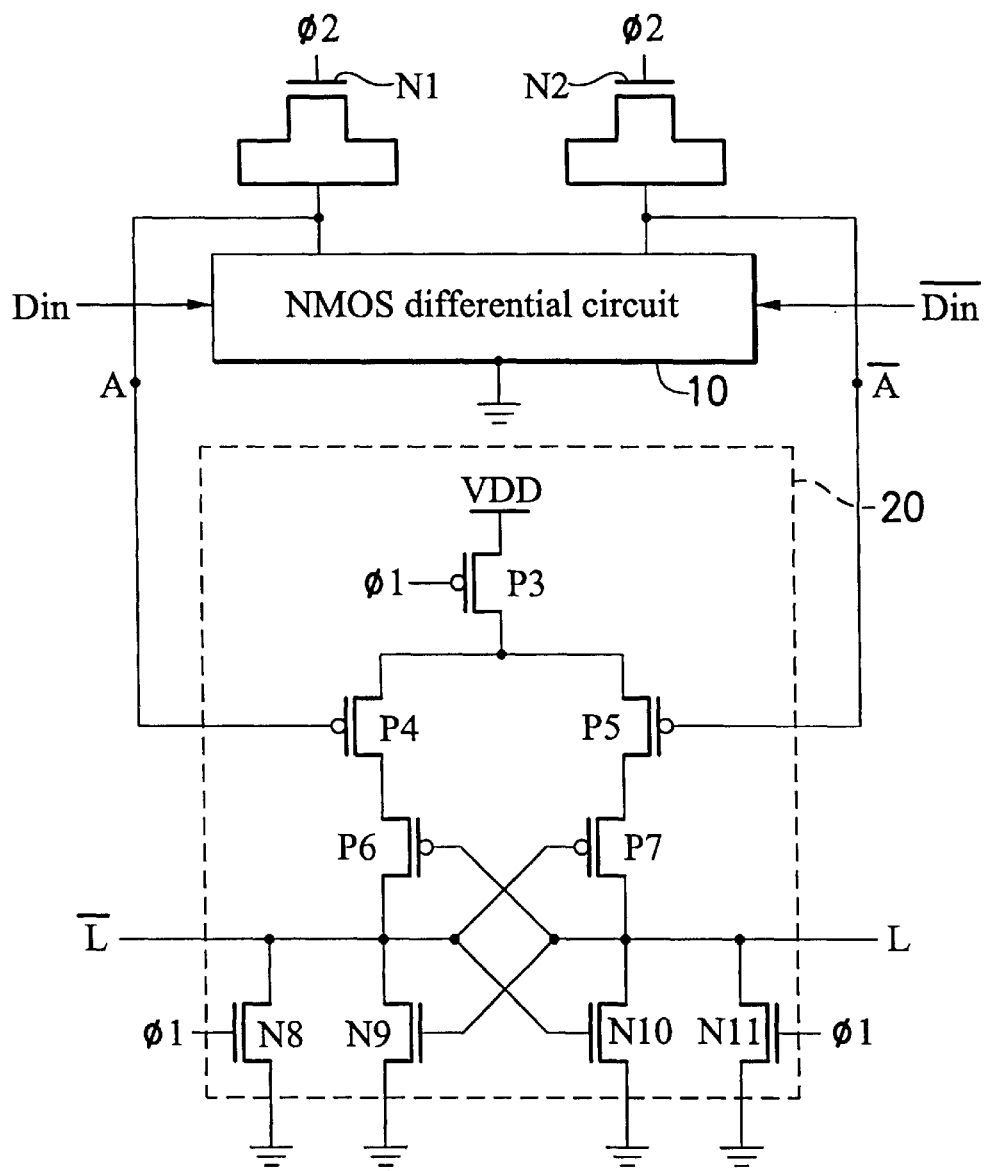
FIG. 1 shows the capacitor-coupling differential logic circuit in accordance with the first embodiment of the present invention.

FIG. 1 shows the capacitor-coupling differential logic circuit according to this embodiment. As shown in the diagram, the capacitor-coupling differential logic circuit mainly comprises two coupling capacitors constructed by NMOS transistors N1 and N2, NMOS differential circuit 10 and sense amplifier 20.

The source and drain of NMOS transistor N1 are connected together, while the gate is connected to the control signal 2, forming a coupling capacitor using the structure of metal-oxide-semiconductor layer. Similarly, NMOS transistor N2 forms another coupling capacitor. The coupling capacitors couple the control signal Ø2 to the internal differential terminal pair A/$\overline{A}$. In addition, apart from the MOS transistor, the coupling capacitors can be formed by two wires with dielectric material existing between different layers or within the same layer.

NMOS differential circuit 10 is a differential logic circuit receiving differential input signals Din and $\overline{Din}$ and generating corresponding differential output signals at its output terminals according to its internally set logic function. In this embodiment, the output terminals of NMOS differential circuit 10 are connected to the internal differential terminal pair A/$\overline{A}$, meanwhile the internal differential terminal pair A/$\overline{A}$ is connected to the input terminals of the sense amplifier 20.

The sense amplifier 20 consists of PMOS transistors P3, P4, P5, P6, P7 and NMOS transistors N8, N9, N10, N11. As shown in the diagram, PMOS transistors P4 and P5 are input transistors with their gates connected to internal differential terminal pair A/$\overline{A}$ respectively. PMOS transistor P3 is a control transistor with its gate controlled by the control signal Ø1 to control whether the whole sense amplifier 20 is operating. Its source is connected to the high voltage VDD and its drain is connected to the sources of PMOS transistors P4 and P5. PMOS transistors P6 and P7 and NMOS transistors N9 and N10 form the cross-coupling configuration to amplify the signal using positive feedback and send the amplified signal to the output signal line pair L/$\overline{L}$. NMOS transistors N8 and N11 form the pre-charging transistors with their gates connected to the control signal Ø1. The pre-charging transistors pre-charge the signal line pair L/$\overline{L}$ to the ground voltage when the control signal Ø1 conducts NMOS transistors N8 and N11.

Figure 2:
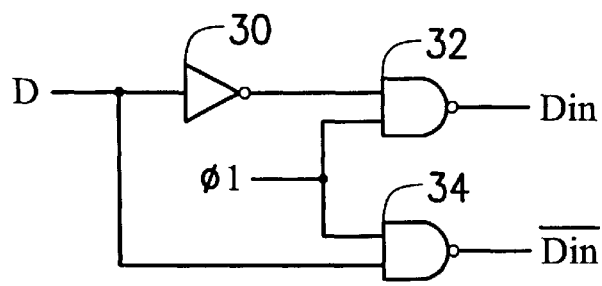
FIG. 2 shows the circuit that generates input signal pair (Din/$\overline{\text{Din}}$) of FIG. 1.

FIG. 2 shows the circuit generating the input signal pair Din/$\overline{Din}$ in FIG. 1. As shown in the diagram, the circuit includes inverting gate 30, NAND gate 32 and NAND gate 34. Its input terminal is a data signal D. The negative edge of the control signal 1 presets the circuit differential output Din and $\overline{Din}$ to VDD, while the positive edge of the control signal 1 triggers its output terminal to send the complementary differential input signal Din/$\overline{Din}$.

Figure 3:
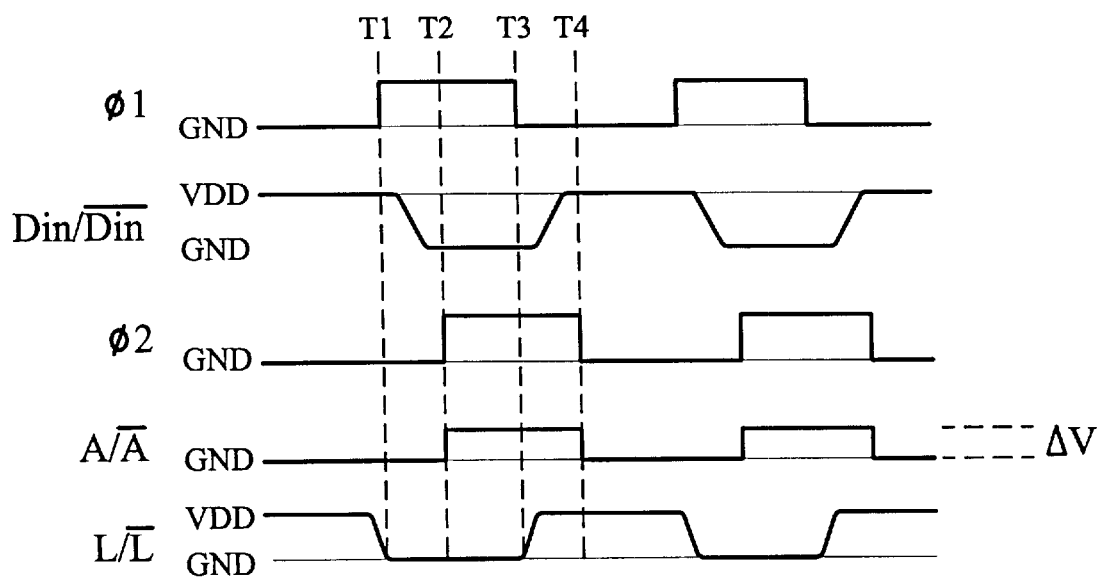
FIG. 3 shows the schematic diagram of signal waveforms of signals-in FIG. 1.

FIG. 3 shows the schematic diagram of the waveforms of signals in FIG. 1. There is a predetermined time delay relationship between the control signal Ø1 and the control signal Ø2. Next, the detailed operation of the signal waveforms according to the capacitor-coupling differential logic circuit in FIG. 1 and the corresponding timing relationship in FIG. 3 will be explained.

When the control signal Ø1 is at logic "0", the input Din and $\overline{Din}$ are preset to VDD, so both sides of NMOS differential circuit 10 conduct and A and $\overline{A}$ are connected to ground, i.e., preset to "0".

At time T1, the control signal Ø1 rises to "1". Therefore, the NMOS transistors N8 and N11 conduct, and the output signal line pair L/$\overline{L}$ is pre-charged to ground. On the other hand, because PMOS transistor P3 does not conduct, the whole sense amplifier 20 is turned off. Furthermore, all the differential input signals Din/$\overline{Din}$ are input to the NMOS differential circuit 10 and one end of the output terminal (i.e., the internal differential terminal pair A/$\overline{A}$) is connected to 0V and the other end is turned off via the internally set logic operations.

At time T2, the control signal Ø2 rises to "1" and the control signal 1 maintains at "1". The control signal Ø2 will be coupled to the internal differential terminal pair A/$\overline{A}$ using the capacitor coupling effect of NMOS transistors N1 and N2, i.e., the internal differential terminal pair A/$\overline{A}$ will rise toward logic "1". However, because one end of the NMOS differential circuit 10 conducts, the coupled charges at one end of the internal differential terminal pair A/$\overline{A}$ will discharge through the conducting path and the coupled charges at the other end will maintain. This results in the voltage difference ΔV between the two ends. The size of voltage difference ΔV is related to the coupling capacitance of the capacitors formed by transistors N1 and N2. Assume the coupling capacitance is $C_c$, and the total capacitance of the internal differential terminal pair A/$\overline{A}$ is $C_T$. When the control signal Ø2 is changed to high voltage VDD, the voltage difference ΔV can be expressed as:

$$\Delta V = \frac{C_c \cdot VDD}{C_c + C_T} \quad (1)$$

wherein $C_T$ includes the gate input capacitor of the input device, the source/drain junction capacitor of the differential circuit and the internal winding capacitance relating to the state of the input signal and the state of the transistor bias voltage.

Next, at time T3, the control signal Ø1 falls down to "0". PMOS transistor P3 conducts, while NMOS transistors N8 and N11 do not conduct. Therefore, the whole sense amplifier 20 starts to operate. Because there is a small voltage difference at the internal differential terminal pair A/$\overline{A}$, the complementary differential signal of normal level can be generated at output signal line pair L/$\overline{L}$ by using the amplifying operation of the sense amplifier 30.

Finally, at time T4, the control signal Ø2 falls from "1" to "0". At this time, the voltage-difference resulting from the capacitance coupled to the internal differential terminal pair A/$\overline{A}$ starts to decrease; however, the complementary differential signal of the output signal line pair L/$\overline{L}$ is not affected.

The complementary differential signal output by output signal line pair L/$\overline{L}$ will not be preset to "0" until the next time the control signal 1 rises from "0" to "1" thereby conducting NMOS transistors N8 and N11.

A few features can be discovered from the above operations. First, charges induced on internal differential terminal pair A/$\overline{A}$ using the coupling capacitance and the corresponding voltage difference result from coupled charges using NMOS differential circuit 10. This voltage difference is smaller. Secondly, this voltage difference is amplified using sense amplifier 20 resulting in a differential signal of normal level and transmitted to the next stage. Since only a small voltage is required difference to implement the logic, the speed becomes faster and the power consumption is lower.

Figure 4:
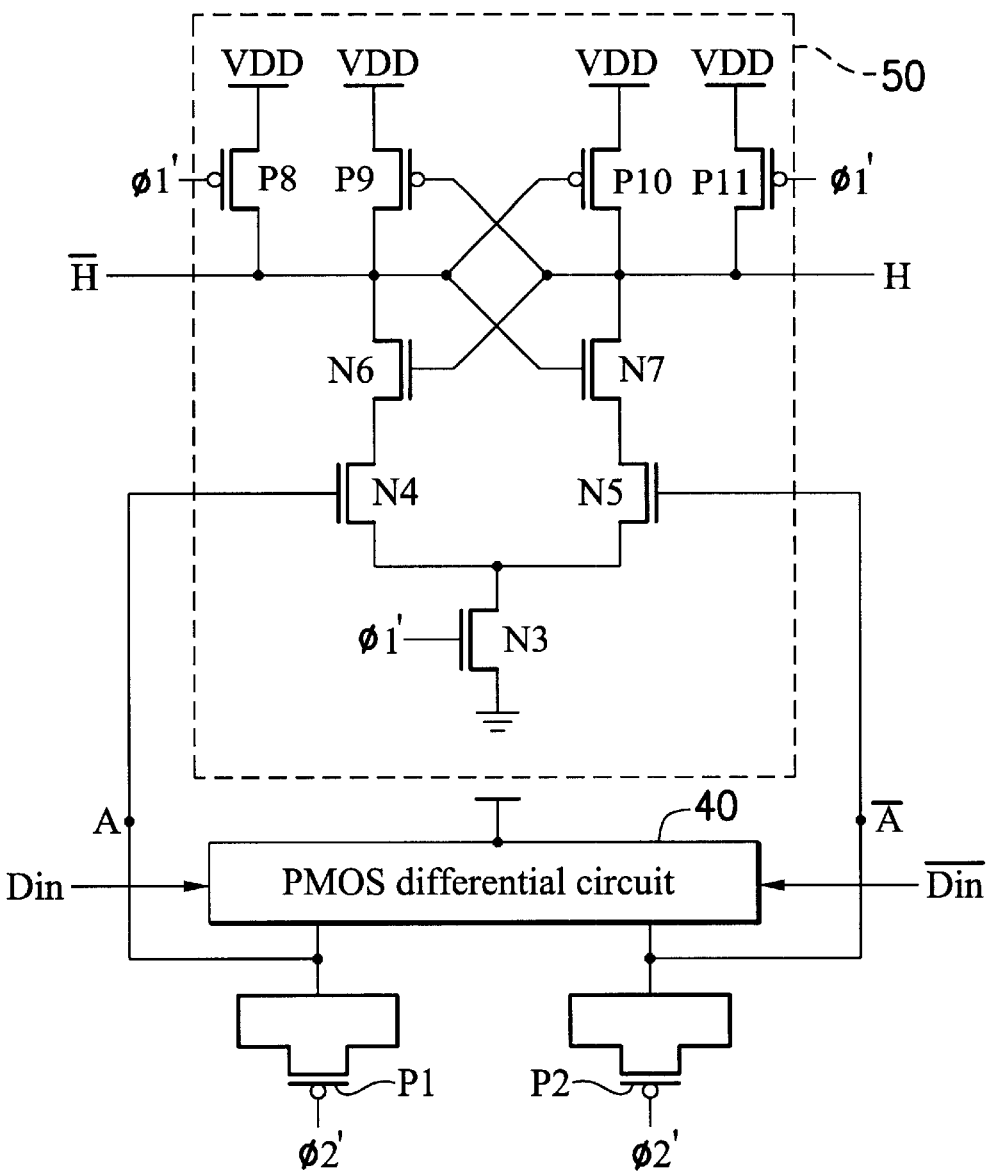
FIG. 4 shows another capacitor-coupling differential logic circuit in accordance with the fist embodiment of the present invention.

FIG. 4 shows the circuit diagram of another capacitor-coupling differential logic circuit of this embodiment. It is basically complementary to FIG. 1. The capacitor-coupling differential logic circuit of FIG. 4 includes two coupling capacitors constructed by PMOS transistors P1 and P2, PMOS differential circuit 40 and sense amplifier 50. The gates of PMOS transistors P1 and P2 are connected to control signal Ø2' for coupling the control signal Ø2' to internal differential terminal pair A/$\overline{A}$. PMOS differential circuit 40 receives differential input signal Din and $\overline{\text{Din}}$. According to the logic function set internally, a corresponding differential output signal is generated on the internal differential terminal pair A/$\overline{A}$. In sense amplifier 50, NMOS transistors N4 and N5 act as input transistors. The gate of NMOS transistor N3 is controlled by control signal Ø1' for controlling whether the whole sense amplifier 50 operates. The source of the transistor N3 is connected to ground voltage, while the drain is connected to the sources of the NMOS transistors N4 and N5. NMOS transistors N6 and N7 and PMOS transistors P9 and P10 amplify the signal using positive feedback, and then send the signal to the output signal line-pair H/$\overline{H}$. When PMOS transistors P8 and P11 act as pre-charging transistors, when PMOS transistors P8 and P11 are conducted by control signal Ø1', the signal line pair H/$\overline{H}$ can be pre-charged to high voltage VDD.

Figure 5:
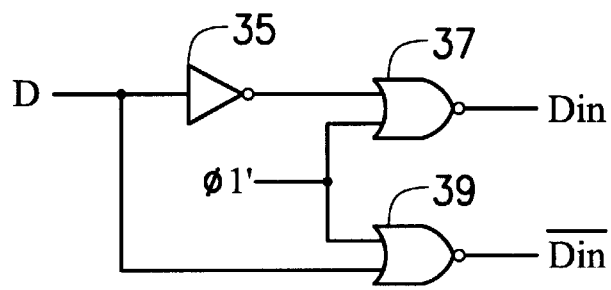
FIG. 5 shows the circuit that generates input signal pair (Din/$\overline{\text{Din}}$) of FIG. 4.

FIG. 5 shows the circuit diagram for producing input signal pair Din/$\overline{\text{Din}}$ in FIG. 4. As shown in the diagram, it includes inverting gate 35, NOR gate 37 and NOR gate 39. The positive edge of control signal Ø1' presets the differential output Din/$\overline{\text{Din}}$ to be 0V, while the negative edge triggers the output terminal to send out the complementary differential signals Din/$\overline{\text{Din}}$.

Figure 6:
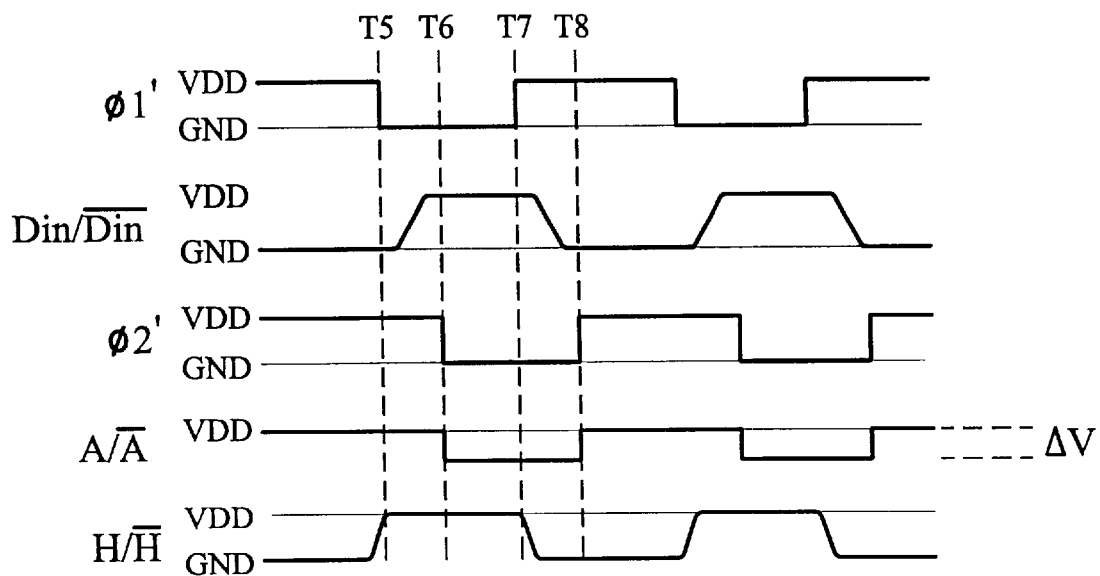
FIG. 6 shows the schematic diagram of signal waveforms of signals in FIG. 4.

FIG. 6 shows signal waveforms of signals in FIG. 4. The waveforms are similar to FIG. 3 but with opposite signal polarity. On the other hand, all the differential input signals Din/$\overline{\text{Din}}$ are input to PMOS differential circuit 40. One terminal of the output terminals is connected to VDD, the other terminal is turned off via internally set logic operation. At time point T5, control signal Ø1' falls to "0", so the output signal line pair H/$\overline{H}$ is pre-charged to high voltage VDD, and the whole sense amplifier 50 is turned off. At time point T6, control signal Ø2 falls to "0", the internal differential terminal pair A/$\overline{A}$ will fall toward logic "0" via capacitor coupling. However, because the one end of original PMOS differential circuit 40 conducts, there is voltage difference ΔV between the two terminals of the internal differential terminal pair A/$\overline{A}$. At time point T7, control signal Ø1' rises to "1" and sense amplifier 50 starts to operate, amplifying the small voltage difference ΔV existing between the internal differential terminal pair A/$\overline{A}$ and produces the complementary differential signal of normal level on output signal line pair H/$\overline{H}$. At time point T8, control signal Ø2' rises from "0" to "1"; however, the complementary differential signal of output signal line pair H/$\overline{H}$ is not affected, the complementary differential signal output from output signal line pair H/$\overline{H}$ will not be preset to "1" until the next time the control signal 1' falls to 0 from "1".

As mentioned above, the logic implementation of the capacitor-coupling differential logic circuit of the present invention (i.e., the PMOS differential circuit or the NMOS differential circuit) requires only a differential signal pair with a small voltage difference, so the logic processing speed is very fast and power consumption is low.

In addition to using the circuit of FIG. 2, the input signal Din/$\overline{\text{Din}}$ of FIG. 1 can be generated by using a dynamic differential logic circuit with VDD as its preset differential output. In addition to using the circuit of FIG. 5, the input signal Din/$\overline{\text{Din}}$ of FIG. 4 can be generated by using the dynamic differential logic circuit with "GND" as its preset differential output.

Second Embodiment

In the first embodiment, MOS transistors or other types of semiconductors are used to form coupling capacitors. and couple the control signal Ø1 to internal differential terminal pair A/$\overline{A}$. To simplify the circuit, this embodiment uses parasitic capacitance to achieve the same effect.

Figure 7:
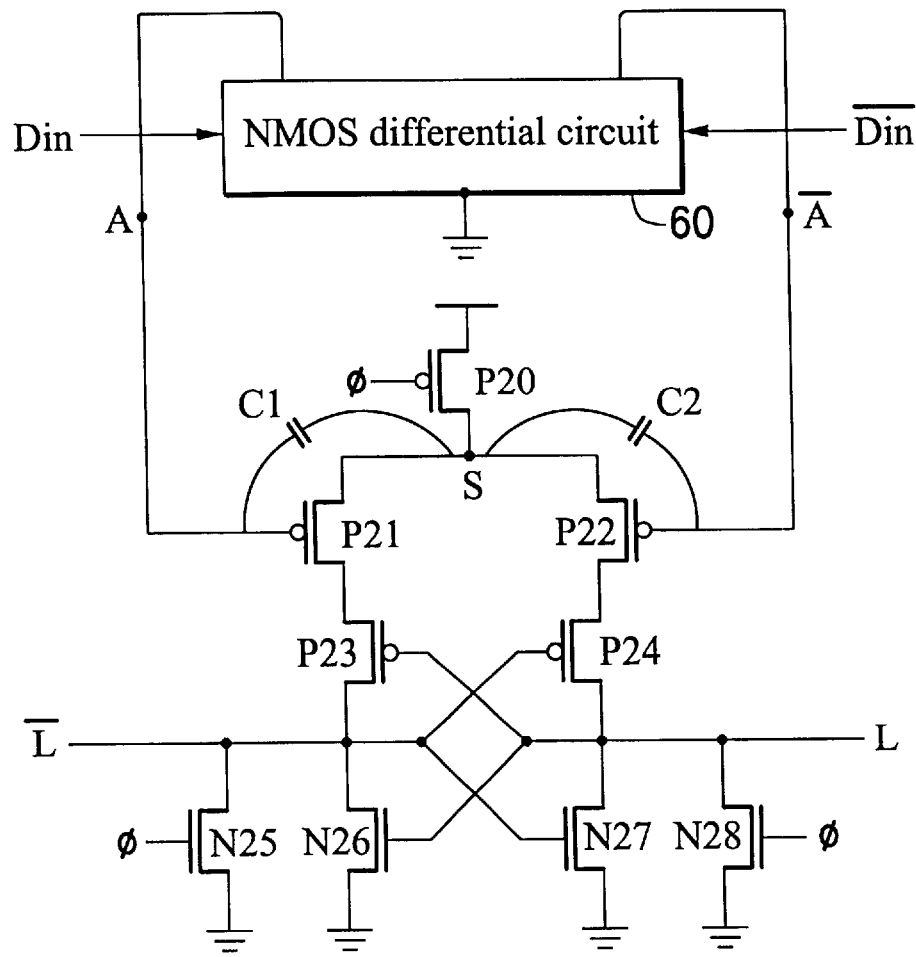
FIG. 7 shows the capacitor-coupling differential logic circuit in accordance with the second embodiment of the present invention.

FIG. 7 shows the circuit diagram of the capacitor coupling the differential logic circuit of this :embodiment. The basic circuit is similar to that of FIG. 1 except that the parasitic capacitors C1 and C2 of PMOS transistors P21 and P22 serving as input transistors are used instead of the original coupling capacitors. In other words, NMOS differential circuit 60 has the same effect as NMOS differential circuit 10 in FIG. 1. In addition, PMOS transistors P20, P21, P22, P23 P24 and NMOS transistors N25, N26, N27, N28 form the sense amplifier, whose operations are, the same as those of the corresponding elements of FIG. 1. Thus, they will not be described again. The parasitic capacitors C1 and C2 can be used to couple the voltage change of node S to the internal differential terminal pair A/$\overline{A}$. In addition, the capacitor-coupling differential logic circuit only uses control signal Ø of single pulse waveform type.

Figure 8:
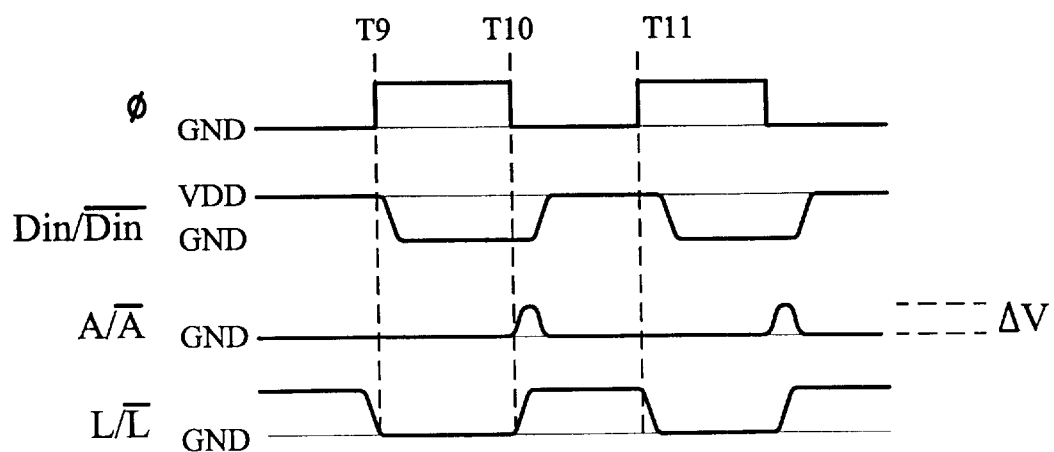
FIG. 8 shows the schematic diagram of the signal waveforms of signals in FIG. 7.
Figure 9:
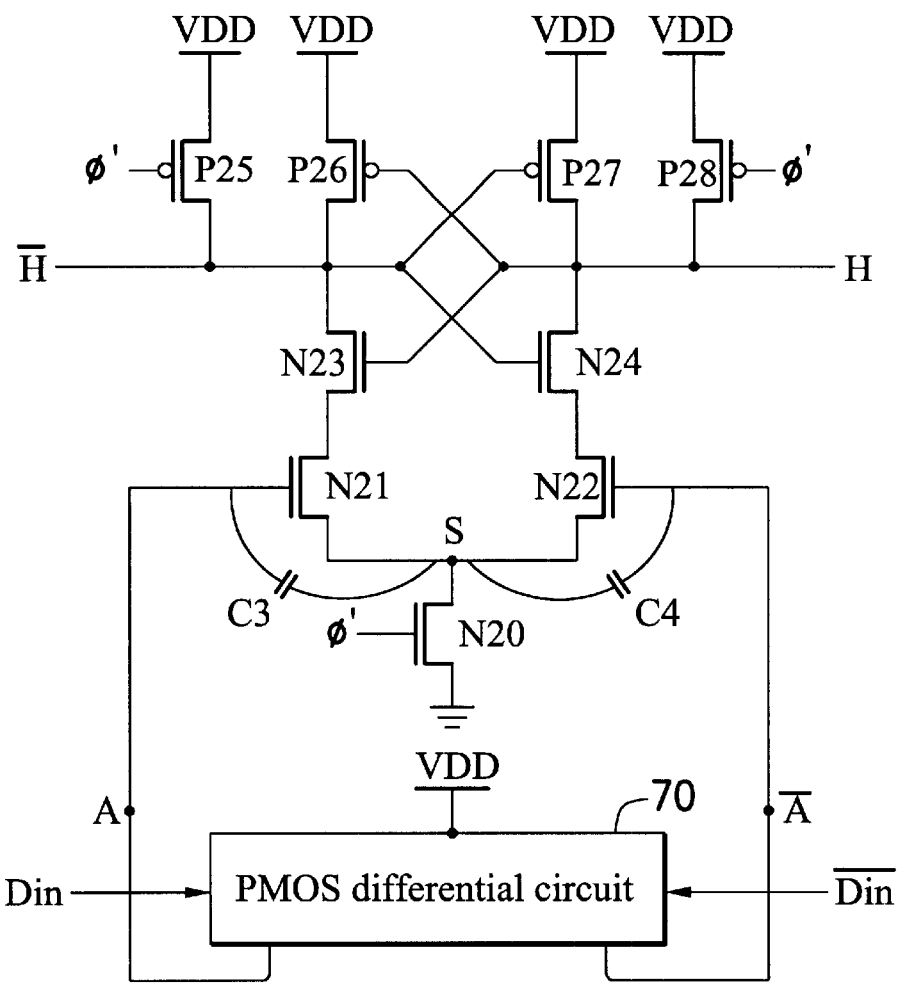
FIG. 9 shows another capacitor-coupling differential logic circuit in accordance with the second embodiment of the present invention.
Figure 10:
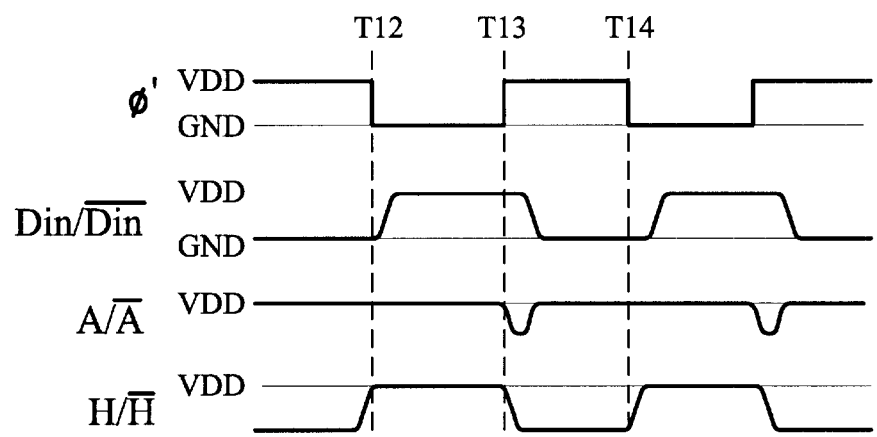
FIG. 10 shows the signal waveforms of signals in FIG. 9.

FIG. 8 shows the waveforms of signals in FIG. 7. Their operation is described next with reference to FIG. 7. At time point T9, control signal Ø rises to "1". Therefore, PMOS. transistor P20 does not conduct, the whole sense amplifier does not operate. Furthermore, NMOS transistors N25 and N28 conduct, so the output signal line pair L/$\overline{L}$ is pre-charged to ground voltage. At time point T10, control signal Ø falls to "0". PMOS transistor P20 conducts, so the voltage of node S rises gradually toward VDD, and the whole sense amplifier starts to operate. The voltage at node S is coupled to the internal differential terminal pair A/$\overline{A}$ via the coupling effect of the parasitic capacitance C1 and C2 (Cgs of P21 and P22). The coupled voltage difference makes the signal of the internal differential terminal pair A/$\overline{A}$ become voltage difference ΔV. On the other hand, since the sense amplifier starts to operate, the voltage difference ΔV is amplified and output to the output signal line pair L/$\overline{L}$. Next, the differential input signal Din/$\overline{\text{Din}}$ preset to VDD is input to NMOS differential circuit 60 so that both terminals of the internal differential terminal pair are grounded, thereby discharging the coupled charges through the conducting path. In the process of operation, after the coupled voltage difference is amplified by the sense amplifier, the input signal Din/$\overline{\text{Din}}$ is preset to VDD, NMOS differential circuit 60 conducts to recover A/$\overline{A}$ to ground. At time T11, control signal Ø rises up again to "1", so the output signal line pair L/$\overline{L}$ is set to ground voltage. Similarly, the parasitic capacitance can be used instead of the coupling capacitance in the capacitor-coupling differential logic circuit in FIG. 4. FIG. 9 shows another circuit diagram of the capacitor-coupling differential logic circuit of this embodiment. FIG. 10 shows the waveforms of signals in FIG. 9. At time point T12, control signal Ø' falls to "0". Therefore, NMOS transistor N20 does not conduct, and the whole sense amplifier does not operate. Furthermore, PMOS transistors P25 and P28 conduct, so their output signal line pair H/$\overline{H}$ is pre-charged to voltage VDD. At time point T13, control signal Ø' rises to "1". NMOS transistor N20 conducts, so the voltage of the node S falls gradually toward ground voltage and the whole sense amplifier starts to operate. The voltage of node S is coupled to the internal differential terminal pair A/$\overline{A}$ via the coupling effect of parasitic capacitance C3 and C4(Cgs of N21 and N22). The coupled voltage difference ΔV makes the signal on the internal differential terminal pair A/$\overline{A}$ become voltage difference ΔV. On the other hand, since the sense amplifier starts to operate, the voltage difference is amplified and output to output signal line pair H/$\overline{H}$. Next, the differential input signal Din/$\overline{Din}$ preset to 0V is input to PMOS differential circuit 70, so that both terminals of internal differential terminal, pair A/$\overline{A}$ conduct to VDD, thereby charging both terminals via the conducting path. In the process of operation, after the coupled voltage difference is amplified, the input signal Din/$\overline{Din}$ is preset to GND, and PMOS differential circuit 70 conducts to. recover A/$\overline{A}$ to VDD. At time point T14, the control signal falls down to "0" again. Therefore, the output signal line pair H/$\overline{H}$ is set to voltage VDD again.

The capacitor-coupling differential logic circuit of this embodiment can achieve the same effect as the first embodiment. Although the circuit elements are simplified, the value of parasitic capacitance is small. Therefore, $C_T$ design has to be considered simultaneously. Furthermore, parallel capacitors can be added to C1/C2 of FIG. 7 and C3/C4 of FIG. 9, thereby increasing the size of coupling capacitance.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A capacitor-coupling differential logic circuit, comprising:
   a differential logic circuit having at least an external input terminal for receiving an input signal, an internally set logic function and an internal differential pair;
   a pair of coupling capacitors having a first capacitor and a second capacitor, the first capacitor having a first end coupled to a first control signal and a second end coupled to a first internal differential terminal of the internal differential terminal pair directly, the second capacitor having a first end coupled to the first control signal and a second end coupled to a second internal differential terminal of the internal differential terminal pair directly; and
   a sense amplifier having a input terminal pair connected to the internal differential pair for amplifying a voltage difference at the internal differential pair and outputting to an output terminal pair of the sense amplifier;
   wherein the differential logic circuit generates a logic state at the internal differential terminal pair according to the input signal and the internally set logic function, and the pair of the coupling capacitors couples the first control signal to the internal differential terminal pair to generate a voltage difference at the internal differential terminal pair according to the logic state.

2. The capacitor-coupling differential logic circuit as claimed in claim 1, wherein the first capacitor and the second capacitor of the pair of the coupling capacitors are capacitors formed by metal/boxide/semiconductor(MOS) transistors.

3. The capacitor-coupling differential logic circuit as claimed in claim 1, wherein the first capacitor and the second capacitor of the pair of the coupling capacitors are capacitors formed by spaced wires.

4. The capacitor-coupling differential logic circuit as claimed in claim 1, wherein the first control signal is a pulse.

5. The capacitor-coupling differential logic circuit as claimed in claim 1, wherein the operation of the sense amplifier is controlled by a second control signal.

6. The capacitor-coupling differential logic circuit as claimed in claim 5, wherein the first control signal and the second control signal are pulses spaced apart by a predetermined time delay.

7. The capacitor-coupling differential logic circuit as claimed in claim 5, wherein the sense amplifier comprises a first pre-charging transistor and a second pre-charging transistor being controlled by the second control signal for pre-charging the output terminal pair of the sense amplifier to a predetermined voltage.

8. The capacitor-coupling differential logic circuit as claimed in claim 7, wherein the predetermined voltage is the grounded voltage.

9. The capacitor-coupling differential logic circuit as claimed in claim 7, wherein the predetermined voltage is a highest voltage applied to the capacitor-coupling differential logic circuit.

10. A capacitor-coupling differential logic circuit, comprising:
    a differential circuit having at least an external input terminal for receiving an input signal and an internal differential terminal pair; and
    a sense amplifier having an input terminal pair connected to the internal differential terminal pair for amplifying the input signal of the internal differential terminal pair and outputting to an output terminal pair of the sense amplifier, the sense amplifier having a first input transistor and a second input transistor having gates corresponding to the input terminal pair of the sense. amplifier and each having a parasitic capacitor connected between a gate and a source thereof, a control transistor has a source connected to the sources of the first input transistor and the second input transistor and a drain connected to a first predetermined voltage;
    wherein the parasitic capacitance couples the first predetermined voltage to the internal differential terminal pair when the control transistor conducts, and the differential circuit generates a voltage difference on the internal signal at the internal differential terminal pair according to the input signal.

11. The capacitor-coupling differential logic circuit as claimed in claim 10, wherein the control transistor is controlled by a control signal.

12. The capacitor-coupling differential logic circuit as claimed in claim 11, wherein the control signal is a pulse.

13. The capacitor-coupling differential logic circuit as claimed in claim 10, wherein the first predetermined voltage is the grounded voltage.

14. The capacitor-coupling differential logic circuit as claimed in claim 10, wherein the first predetermined voltage is a high voltage of the capacitor-coupling differential logic circuit.

15. The capacitor-coupling differential logic circuit as claimed in claim 10, wherein the sense amplifier comprises a first pre-charging transistor and a second pre-charging transistor being controlled by the second control signal for pre-charging the output terminal pair of the sense amplifier to a second predetermined voltage.

16. The capacitor-coupling differential logic circuit as claimed in claim 15, wherein the second predetermined voltage is the grounded voltage.

17. The capacitor-coupling differential logic circuit as claimed in claim 15, wherein the second predetermined voltage is a highest voltage applied to the capacitor-coupling differential logic circuit.

* * * * *